(12) United States Patent
Randall et al.

(10) Patent No.: US 10,116,102 B2
(45) Date of Patent: Oct. 30, 2018

(54) WIRING DEVICE COMPATIBLE WITH USER-INTERCHANGEABLE MODULES

(71) Applicant: Leviton Manufacturing Company, Inc., Melville, NY (US)

(72) Inventors: William Randall, Melville, NY (US); Ronald Jansen, Ridgewood, NY (US); Eugene Frid, Great Neck, NY (US); Scott Freeman, Melville, NY (US)

(73) Assignee: Leviton Manufacturing Co., Inc., Melville, NY (US)

( * ) Notice: Subject to any disclaimer, the term of this patent is extended or adjusted under 35 U.S.C. 154(b) by 2 days.

(21) Appl. No.: 14/962,408

(22) Filed: Dec. 8, 2015

(65) Prior Publication Data

US 2017/0162985 A1    Jun. 8, 2017

(51) Int. Cl.
*H01R 13/66* (2006.01)
*H01R 25/00* (2006.01)
(Continued)

(52) U.S. Cl.
CPC ....... *H01R 13/6675* (2013.01); *H01R 25/006* (2013.01); *H02J 7/0045* (2013.01); *H05K 7/14* (2013.01); *H02J 2007/0096* (2013.01)

(58) Field of Classification Search
CPC .. H01R 25/006; H01R 13/6675; H01R 24/76; H02G 3/14; H02G 3/18; H02J 2007/0062;
(Continued)

(56) References Cited

U.S. PATENT DOCUMENTS

| 3,588,489 A | * | 6/1971 | Gaines | H01R 13/717 |
| | | | | 362/95 |
| 5,686,808 A | * | 11/1997 | Lutz | H01M 10/44 |
| | | | | 320/106 |

(Continued)

FOREIGN PATENT DOCUMENTS

WO    WO-2012068635 A1    5/2012

OTHER PUBLICATIONS

PCT International Search Report for PCT/US2016/063319 dated Mar. 14, 2017.

(Continued)

*Primary Examiner* — James Wu
(74) *Attorney, Agent, or Firm* — Carter, Deluca, Farrell & Schmidt, LLP

(57) ABSTRACT

A wiring device includes a strap having mounting holes to facilitate fastening of the wiring device to an electrical box, a housing having a face accessible once the wiring device is fastened to the electrical box, the face having an area divided into a first region and a second region, a first line voltage electrical outlet accessible through a first set of apertures on the first region of the face and a user-interchangeable module accessible on the second region of the face, the user-interchangeable module including a low voltage port configured to receive a male charging connector of a charging cable connected to an external device. The wiring device comprises charging circuitry within the housing, the charging circuitry being configured to provide charging current to the external device. The charging circuitry has an electrical operating parameter configurable automatically by a characteristic of the user-interchangeable module or the external device.

15 Claims, 13 Drawing Sheets

(51) Int. Cl.
*H02J 7/00* (2006.01)
*H05K 7/14* (2006.01)

(58) Field of Classification Search
CPC ............. H02J 2007/0096; H02J 7/0044; H02J 7/0045; H02J 7/0052; H05K 7/14
USPC ........................................................ 361/807
See application file for complete search history.

(56) References Cited

U.S. PATENT DOCUMENTS

| | | | |
|---|---|---|---|
| 6,087,588 A | 7/2000 | Soules | |
| 6,423,900 B1 | 7/2002 | Soules | |
| 7,641,491 B2* | 1/2010 | Altonen | H01R 13/641 |
| | | | 439/131 |
| 7,859,133 B2 | 12/2010 | Youn et al. | |
| 8,148,954 B1 | 4/2012 | Kehlstadt et al. | |
| 8,350,522 B2 | 1/2013 | Johnson | |
| 8,384,241 B2 | 2/2013 | Chen et al. | |
| 8,450,979 B2 | 5/2013 | Kerr et al. | |
| 8,450,980 B2 | 5/2013 | Kumar et al. | |
| 8,461,805 B2 | 6/2013 | Sa | |
| 8,496,342 B2* | 7/2013 | Misener | H02G 3/18 |
| | | | 174/50 |
| 8,696,368 B2 | 4/2014 | Quezada | |
| 8,841,798 B2 | 9/2014 | Tuukkanen et al. | |
| 2004/0147293 A1* | 7/2004 | Park | H04M 1/04 |
| | | | 455/573 |
| 2008/0012423 A1 | 1/2008 | Mimran | |
| 2008/0024089 A1* | 1/2008 | Meng | H02J 7/0091 |
| | | | 320/128 |
| 2008/0238356 A1* | 10/2008 | Batson | H02J 7/0045 |
| | | | 320/103 |
| 2009/0180261 A1* | 7/2009 | Angeli Des | H01H 83/04 |
| | | | 361/747 |
| 2010/0045243 A1* | 2/2010 | Mizuno | A63F 13/08 |
| | | | 320/162 |
| 2015/0035476 A1 | 2/2015 | Frid et al. | |

OTHER PUBLICATIONS

PCT Written Opinion of the ISA for PCT/US2016/063319 dated Mar. 14, 2017.

* cited by examiner

WIRING DEVICE COMPATIBLE WITH USER-INTERCHANGEABLE MODULES

BACKGROUND

Technical Field

The present disclosure relates to a wiring device and, more particularly, but not exclusively, relates to a wiring device capable of communicating with user-interchangeable modules having, for example, low voltage ports.

Background of Relevant Art

All residential buildings have wall outlets for powering electronic devices such as lights, appliances, computers, and mobile devices. The AC powered devices have a power cord with a plug configured to be connected to and removed from the wall outlet.

An outlet is a female connector with slots or holes in the wall outlet. The slots are configured to receive a plug. The plug has protruding prongs, blades, or pins that fit into matching slots in the wall outlet. The wall outlet is enclosed by a housing and also a cover typically called a wall plate, face plate, outlet cover, socket cover, or wall cover. Different countries have different national standards for wall outlets. The national standards differ by voltage rating, current rating, connector shape, connector size, and connector type.

Due to proliferation of various rechargeable consumer electronic devices, such as cell phones, laptops, tablets, personal digital assistants (PDA's), and the like, there is a need to charge and/or connect to such devices. Most of these devices are powered by low voltage. Recharging these devices may be facilitated through the use of standard interfaces, such as a Universal Serial Bus (USB).

Thus, there is a need to integrate one or more interchangeable components including low voltage ports into a standard electrical installation in a wall/ceiling of a building.

SUMMARY

The following presents a summary of the claimed subject matter in order to provide a basic understanding of some aspects of the claimed subject matter. This summary is not an extensive overview of the claimed subject matter. It is intended to neither identify key or critical elements of the claimed subject matter nor delineate the scope of the claimed subject matter. Its sole purpose is to present some concepts of the claimed subject matter in a simplified form as a prelude to the more detailed description that is presented later.

According to one aspect of the present disclosure, there is presented a wiring device. The wiring device includes a strap having mounting holes to facilitate fastening of the wiring device to an electrical box, a housing having a face accessible once the wiring device is fastened to the electrical box, the face having an area divided into a first region and a second region, and a first line voltage electrical outlet accessible through a first set of apertures on the first region of the face. The wiring device further includes a user-interchangeable module accessible on the second region of the face, the user-interchangeable module including a low voltage port configured to receive a male charging connector of a charging cable connected to an external device, the user-interchangeable module being removable from the housing of the wiring device. The wiring device further comprises charging circuitry within the housing, the charging circuitry being configured to provide charging current to the external device. The charging circuitry has an electrical operating parameter configurable automatically by a characteristic of the user-interchangeable module or the external device that is communicated to the charging circuitry.

According to another aspect of the present disclosure, a wiring device is presented. The wiring device includes a strap having mounting holes to facilitate fastening of the wiring device to an electrical box, a housing having a face accessible once the wiring device is fastened to the electrical box, the face having an area divided into a first region and a second region, a first line voltage electrical outlet accessible through a first set of apertures on the first region of the face, and a user-interchangeable module including a rechargeable battery pack, the user-interchangeable module received within the second region defined by the housing.

According to another aspect of the present disclosure, a wiring device is presented. The wiring device includes a strap having mounting holes to facilitate fastening of the wiring device to an electrical box, a housing having a face accessible once the wiring device is fastened to the electrical box, the face having an area, and a user-interchangeable module including a rechargeable battery pack, the user-interchangeable module received within the area of the face.

Further scope of applicability of the present disclosure will become apparent from the detailed description given hereinafter. However, it should be understood that the detailed description and specific examples, while indicating preferred embodiments of the present disclosure, are given by way of illustration only, since various changes and modifications within the spirit and scope of the present disclosure will become apparent to those skilled in the art from this detailed description.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the present invention may be more readily understood by one skilled in the art with reference being had to the following detailed description of several embodiments thereof, taken in conjunction with the accompanying drawings wherein like elements are designated by identical reference numerals throughout the several views, and in which:

Figure 1:
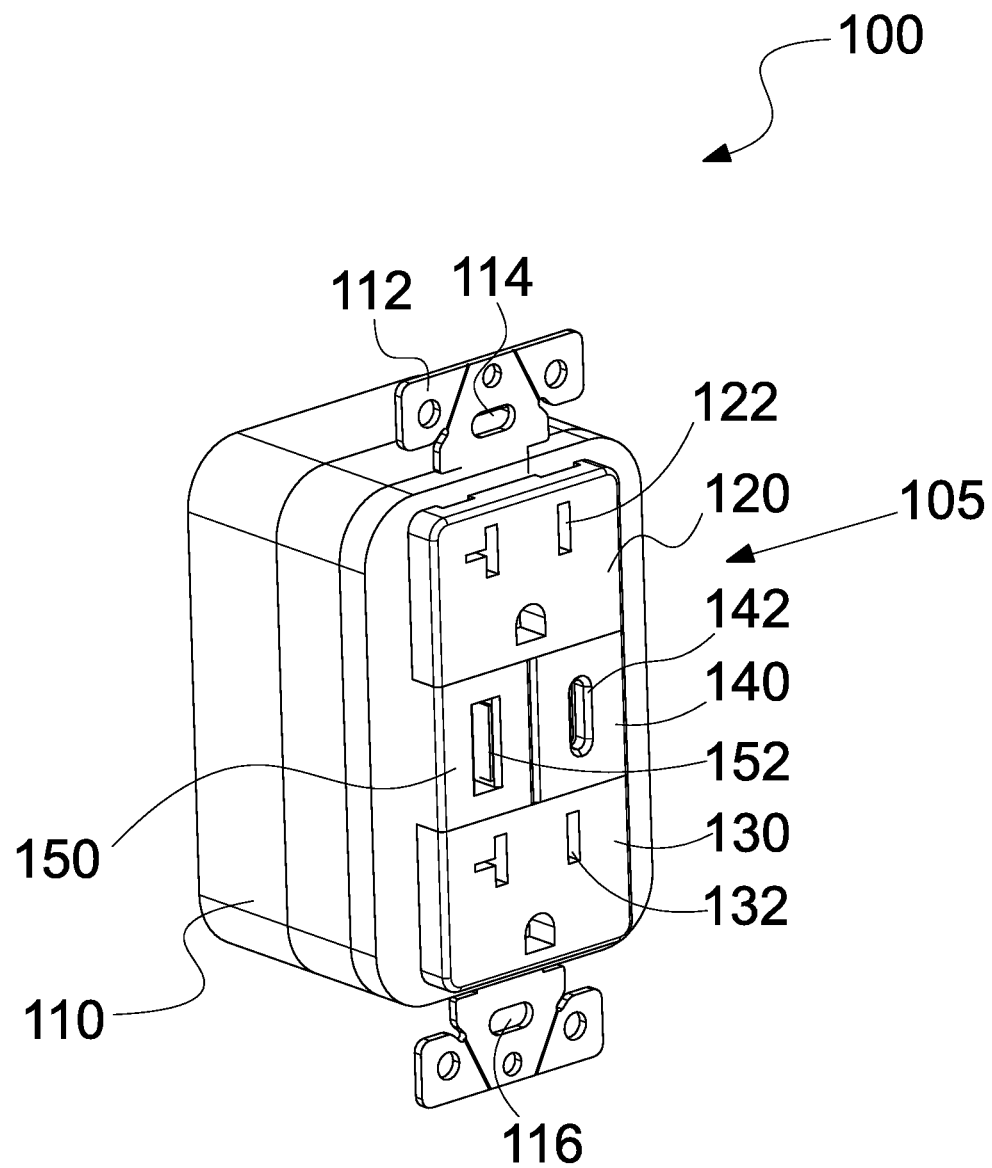
FIG. 1 is a perspective view of a first embodiment of a wiring device with user-interchangeable modules inserted into the housing of the wiring device, according to the disclosure.

The figures depict preferred embodiments of the present disclosure for purposes of illustration only. One skilled in the art will readily recognize from the following discussion that alternative embodiments of the structures and methods illustrated herein may be employed without departing from the principles of the present disclosure described herein.

DETAILED DESCRIPTION

Particular embodiments of the present disclosure are described hereinbelow with reference to the accompanying drawings. However, it is to be understood that the disclosed embodiments are merely exemplary of the disclosure and may be embodied in various forms. Well-known functions or constructions are not described in detail to avoid obscuring the present disclosure in unnecessary detail. Therefore, specific structural and functional details disclosed herein are not to be interpreted as limiting, but merely as a basis for the claims and as a representative basis for teaching one skilled in the art to variously employ the present disclosure in virtually any appropriately detailed structure.

For the purposes of promoting an understanding of the principles of the present disclosure, reference will now be made to the exemplary embodiments illustrated in the drawings, and specific language will be used to describe the same. It will nevertheless be understood that no limitation of the scope of the present disclosure is thereby intended. Any alterations and further modifications of the inventive features illustrated herein, and any additional applications of the principles of the present disclosure as illustrated herein, which would occur to one skilled in the relevant art and having possession of this disclosure, are to be considered within the scope of the present disclosure.

Certain terminology is used in the following description for convenience only and is not limiting. The words "top," "bottom," "central," and "vertical" designate directions in the drawings to which reference is made. The terminology includes the above-listed words, derivatives thereof and words of similar import.

Wiring devices are typically fastened to electrical boxes in walls and ceilings of buildings or in other suitable locations. Some examples of wiring devices include, but are not limited to, switches, outlets, circuit interrupters, dimmers, occupancy sensors, and the like. Additionally, any suitable combinations of these devices can be integrated into a single wiring device.

The sizes of electrical boxes have been standardized within the electrical industry and are typically provided with one or more gangs, such as single, double, triple, and so on. A single gang electrical box is typically 3" high by 2" wide, and may have any suitable depth such as 2", 3", and so on.

Line voltage refers to a voltage, typically Alternating Current (AC), that is supplied to buildings/residences (e.g., electric light and power), for example, 110 VAC, 115 VAC, 120 VAC, 125 VAC, 208 VAC, 220 VAC, 230 VAC, 240 VAC, single or multiphase. Line voltage is typically made available to the end user standard plug/outlet configurations standardized by the National Electrical Manufacturers' Association (NEMA) configurations. One such standardized configuration is a NEMA 5-15 configuration which denotes a nominal 125 VAC/15 Amp outlet.

Low voltage refers to a voltage which is less than a certain threshold (50 Volts for example, AC or DC). This reduced voltage is typically used for communication, signaling, data/multimedia transmission, low voltage charging, and the like. For the purposes of this application, the term low voltage also includes optical transmission (although no electrical voltage is actually transmitted by optical transmission).

Low voltage ports denote any suitable type of low voltage ports, such as, but not limited to, Universal Serial Bus (USB), Audio/Video/Multimedia ports, Digital Visual Interface (DVI), Ethernet/data ports, High Definition Multimedia Interface (HDMI), IEEE 1394 (FireWire), Separate Video (S-Video), Video Graphics Array (VGA), Telephone, and the like, or any suitable combination thereof. For the purposes of this application, low voltage ports can also include fiber optic ports (although no electrical voltage is actually transmitted by fiber optic ports).

As will be generally understood by one skilled in the art, the present disclosure is directed to a wiring device with one or more user-interchangeable modules having low voltage ports. A first embodiment discloses a wiring device with two user-interchangeable modules, that is, they are replaceable or interchangeable low voltage ports. A second embodiment discloses a wiring device with a user-interchangeable module having a replaceable battery pack. More specifically, the low voltage ports are USB charging ports or IEEE 1394 charging ports configured to allow for charging cell phones, laptops, tablets, personal digital assistants (PDA's) and similar devices. The wiring device includes circuitry to convert line voltage to low voltage which powers the USB charging ports or IEEE charging ports, as will be discussed in detail below.

Figure 2:
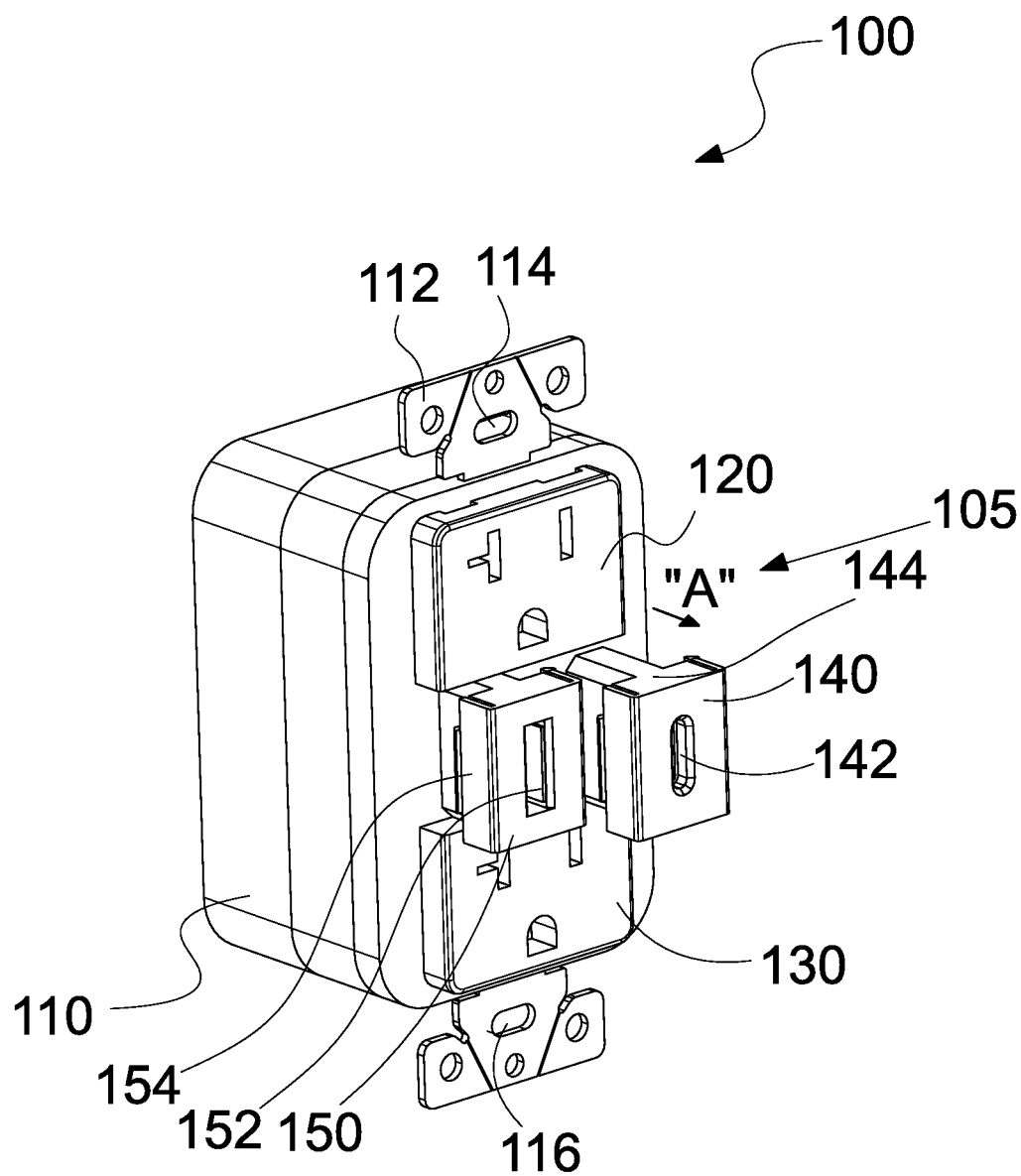
FIG. 2 is a perspective view of the wiring device of FIG. 1 with the user-interchangeable modules partially removed, according to the disclosure.

FIGS. 1 and 2 show the first embodiment of wiring device 100 configured to be fastened to an electrical box. Wiring device 100 includes a housing 110 and a user-accessible face 105 which is accessible after wiring device 100 is fastened to the electrical box. Face 105 includes a plurality of regions, that is, a top region 120, a bottom region 130, and two central regions 140, 150. The top and bottom regions 120, 130 each have a line voltage electrical outlet (e.g. AC outlet). The top region 120 includes outlet apertures 122 and the bottom region 130 includes outlet apertures 132. In this embodiment, face 105 is generally rectangular but can take any suitable shape. This rectangular shape is sometimes referred to as "decorator style" in the electrical industry.

The first central region 140 includes a first user-interchangeable module 142 and the second central region 150 includes a second user-interchangeable module 152. The first and second user-interchangeable modules 142, 152 include low voltage ports. The first and second user-interchangeable modules 142, 152 may also be referred to as replaceable modules. The first and second user-interchangeable modules 142, 152 are oriented in a vertical configuration. In the present embodiment, these low voltage ports are in the form of USB charging ports or IEEE 1394 charging ports that can be used to charge any suitable equipment, such as, but not limited to, cell phones, tablets, laptops, and the like. The user-interchangeable modules 142, 152 may also be referred to as interchangeable modules.

These interchangeable modules 142, 152 can be configured to provide a predetermined amount of charging current, or they may provide an amount of current required by the charged device (i.e., an on-demand current). In addition, interchangeable modules 142, 152 can be configured to provide a level of charging current based on the type of external device that is plugged into the interchangeable modules 142, 152. Additionally, interchangeable modules 142, 152 can provide the same or different levels of charging current. Interchangeable modules 142, 152 can communicate in any suitable manner with the external device(s) plugged into the interchangeable modules 142, 152 (or any other device). In particular, the interchangeable modules 142, 152 are configured to receive a male charging connector of a charging cable connected to the external device. Such communication can be in any suitable form such as unidirectional (one way), bidirectional (two way), wired, optically, and so on. In addition, such communication can utilize any suitable protocol or combinations of protocols, such as, but not limited to, Transmission Control Protocol/Internet Protocol (TCP/IP).

The interchangeable modules 142, 152 can optionally be configured to be controlled and/or connected in any suitable manner by wiring device 100 or by remote devices. In the case of remote devices, these could be on a local network (e.g., LAN/Wi-Fi), and/or on a remote network (e.g., WAN/Internet).

Additionally, the interchangeable modules 142, 152 can optionally be configured to simply transmit data or perform any other suitable function, or any suitable combination of functions. For example, the interchangeable modules 142, 152 may include an additional connector on the rear side of wiring device 100 configured to receive a data cable from within the wall that wiring device 100 is mounted in.

Wiring device 100 also includes a strap 112 which is used to fasten the wiring device 100 to an electrical box. As will be understood by one of ordinary skill in the art, the strap 112 includes a first mounting aperture 114 and a second mounting aperture 116 which receive screws which fasten the wiring device 100 to the electrical box. Housing 110, in combination with the face 105, cooperate to enclose the internal components of wiring device 100. Alternatively, other suitable embodiments of wiring device 100 which do not contain line voltage may be fastened to a mud ring instead of an electrical box.

FIG. 1 is a perspective view of a first embodiment of the wiring device 100 with interchangeable modules 142, 152 inserted into the housing 110 of the wiring device 100, according to the disclosure, whereas FIG. 2 is a perspective view of the wiring device 100 of FIG. 1 with the interchangeable modules 142, 152 partially removed, according to the disclosure.

As illustrated in FIG. 2, the interchangeable modules 142, 152 are replaceable or interchangeable with other interchangeable modules. The interchangeable modules 142, 152 may be moved in direction "A" to be removed from the housing 110. The first interchangeable module 142 has a body portion 144 and the second interchangeable module 152 has a body portion 154. As noted above, the first interchangeable module 142 and the second interchangeable module 152 are low voltage ports, such as USB charging ports. Further, the first interchangeable module 142 may be a first type of USB charging port, whereas the second interchangeable module 152 may be the same or a different type of USB charging port. The first and second interchangeable modules 142, 152 may be substantially aligned with each other.

Moreover, referring to FIGS. 1 and 2, in an alternative embodiment, the interchangeable modules 142, 152 may be integral with the wiring device 100. In other words, the first and second interchangeable modules 142, 152 may be constructed as a single unitary component with the wiring device 100. A wireless charging mechanism may be built into the wiring device 100 such that the interchangeable modules 142, 152 have wireless charging capabilities. In other words, inductive charging takes place since no physical wire is connected to the wiring device 100. This is further discussed below with reference to FIG. 12.

USB charging ports can further be broken out into various form factors such as Type A, Type B, Type C, Mini-A, Mini-B, Micro-A, Micro-B, or any other suitable form. Thus, interchangeable modules 142, 152, may include any type of USB connector. Thus, if the interchangeable module 142 is a Type A USB and the interchangeable module 152 is a Type Micro-A USB, the interchangeable module 142 may be replaced with another interchangeable module including, e.g., a Type B USB and the interchangeable module 152 may be replaced with another interchangeable module including, e.g., a Type Micro-B USB. One skilled in the art may contemplate interchanging either interchangeable module 142, 152 with any other type of interchangeable module having any type of USB connector.

Additionally, referring to FIGS. 1 and 2, in an alternative embodiment, the AC outlets 120, 130 may be constructed as removable AC modules of any suitable type.

Figure 3:
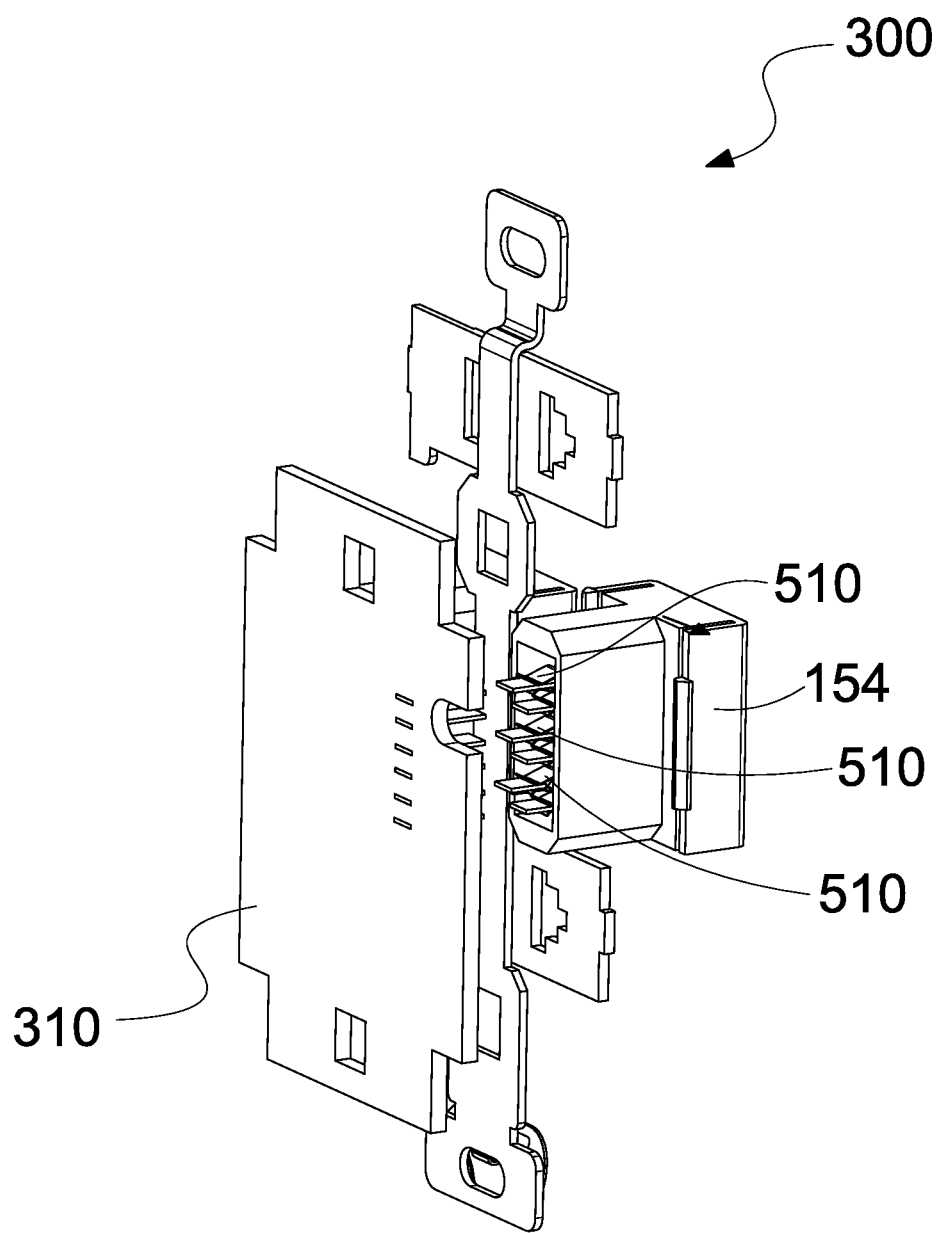
FIG. 3 is a rear perspective view of interior portions of the wiring device of FIG. 1 showing a user-interchangeable module interacting with a plurality of terminals, according to the disclosure.
Figure 4:
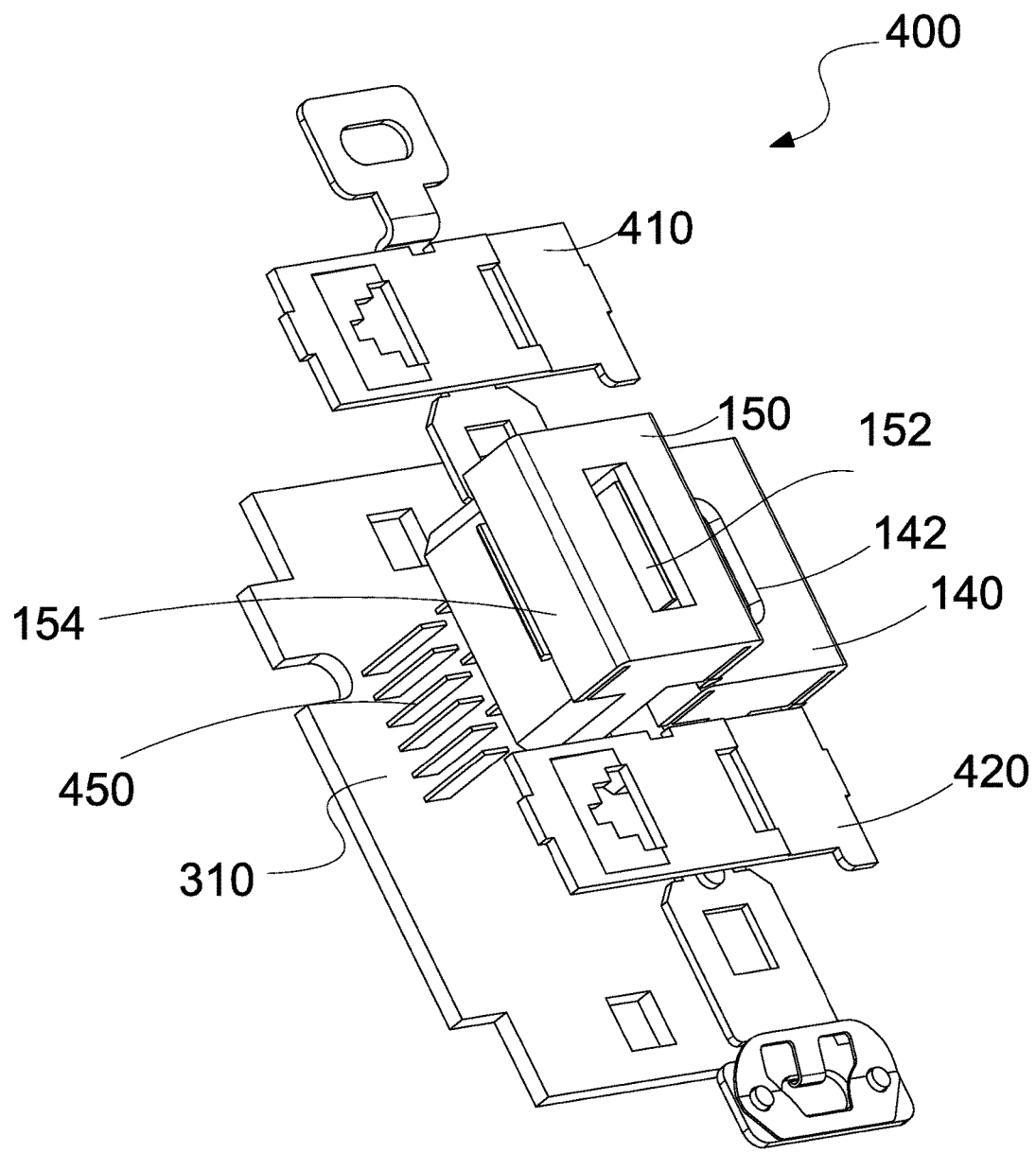
FIG. 4 is a front view of interior portions of the wiring device of FIG. 1 showing a user-interchangeable module interacting with a printed circuit board (PCB) having a plurality of terminals, such as power terminals and/or communication terminals, according to the disclosure.

FIG. 3 is a rear perspective view 300 showing the interchangeable module 154 depicting a plurality of terminals 510, according to the disclosure, whereas FIG. 4 is a front view 400 of the interchangeable module 154 depicting a printed circuit board (PCB) 310 having a plurality of terminals such as power terminals and/or communication terminals 450, according to the disclosure.

The front view 400 illustrates tamper resistance shutters 410 and 420 for receiving blades of a plug. The front view 400 also illustrates the first and second interchangeable modules 142, 152. The interchangeable module, as shown in FIG. 3, has a plurality of terminals 510 on a back end thereof configured to be connected to the plurality of power terminals and/or communication terminals 450 of the PCB 310. Once a connection has been established, power is provided to the interchangeable modules; in this case the interchangeable modules 142, 152. Thus, the interchangeable modules provide power to the electronic devices or external devices connected thereto. In other words, the interchangeable modules charge the electronic devices or external devices connected thereto. A detailed discussion of such electronic handshake between the electronic device (or external device) and the interchangeable modules 142, 152 will be discussed below. Additionally, the interchangeable modules may configure the wiring device to provide suitable voltage levels. The suitable voltage levels may be, for example, 5V, 9V, 12V, 20V, etc.

Figure 5:
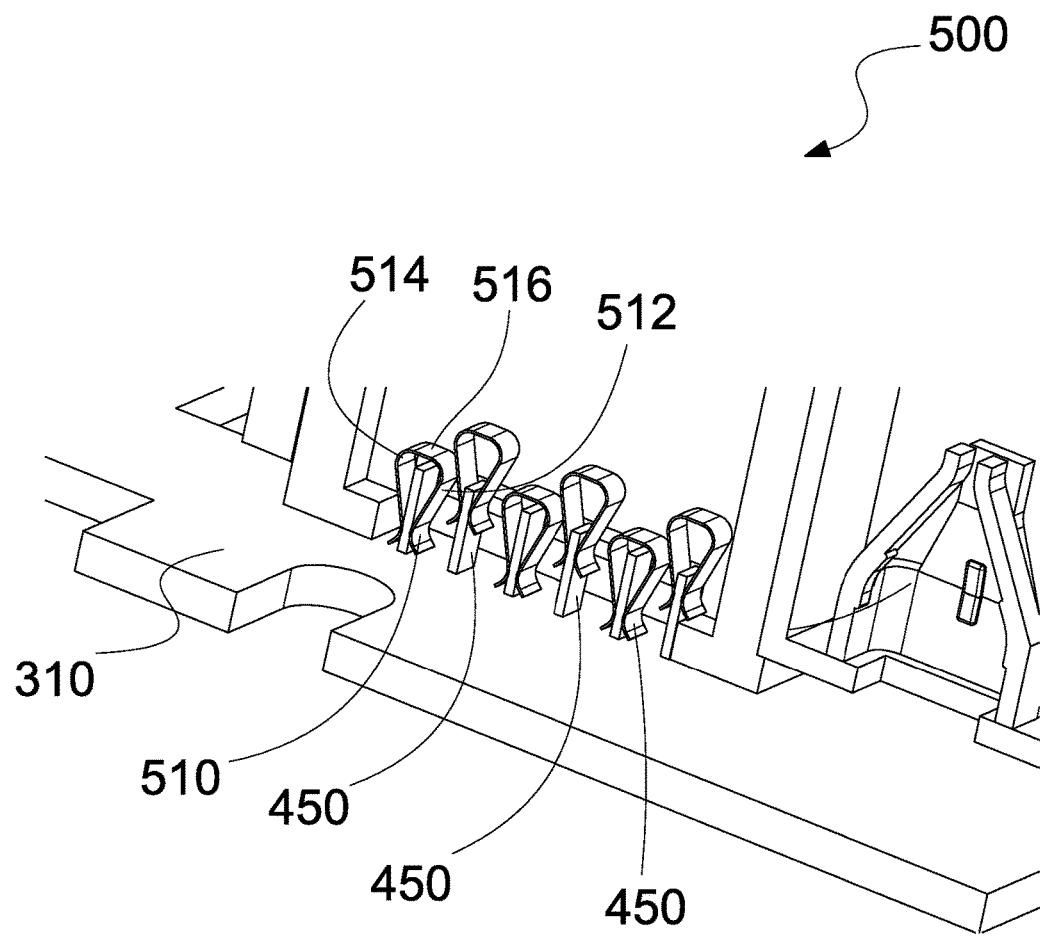
FIG. 5 is an expanded view of the connection between the plurality of power terminals and/or communication terminals of the PCB with the plurality of terminals of the user-interchangeable module, according to the disclosure.

FIG. 5 is an expanded view 500 of the connection between the plurality of power terminals and/or communication terminals 450 of the PCB 310 with the plurality of terminals 510 of the interchangeable modules 142, 152, according to the disclosure.

The plurality of terminals 510 may each have a clip having a first leg 512 and a second leg 514 connected to each other by a base section 516. The first and second legs 512, 514 of each terminal 510 are configured to engage a power terminal or communication terminal 450 to provide power to the interchangeable modules 142, 152. The power terminals or communication terminals 450 may be a plurality of power terminals or communication terminals 450 that are parallel to each other and equally spaced apart with respect to each other. Thus, the interchangeable modules 142, 152 are each powered by the power terminals and/or communication terminals 450 in order to provide power to electronic devices or external devices connected to the interchangeable modules 142, 152.

One skilled in the art may contemplate the interchangeable modules having any type of operations and/or functionality. Thus, one of the interchangeable modules 142, 152 may be a USB port and another may be a different functionality port.

Figure 6:
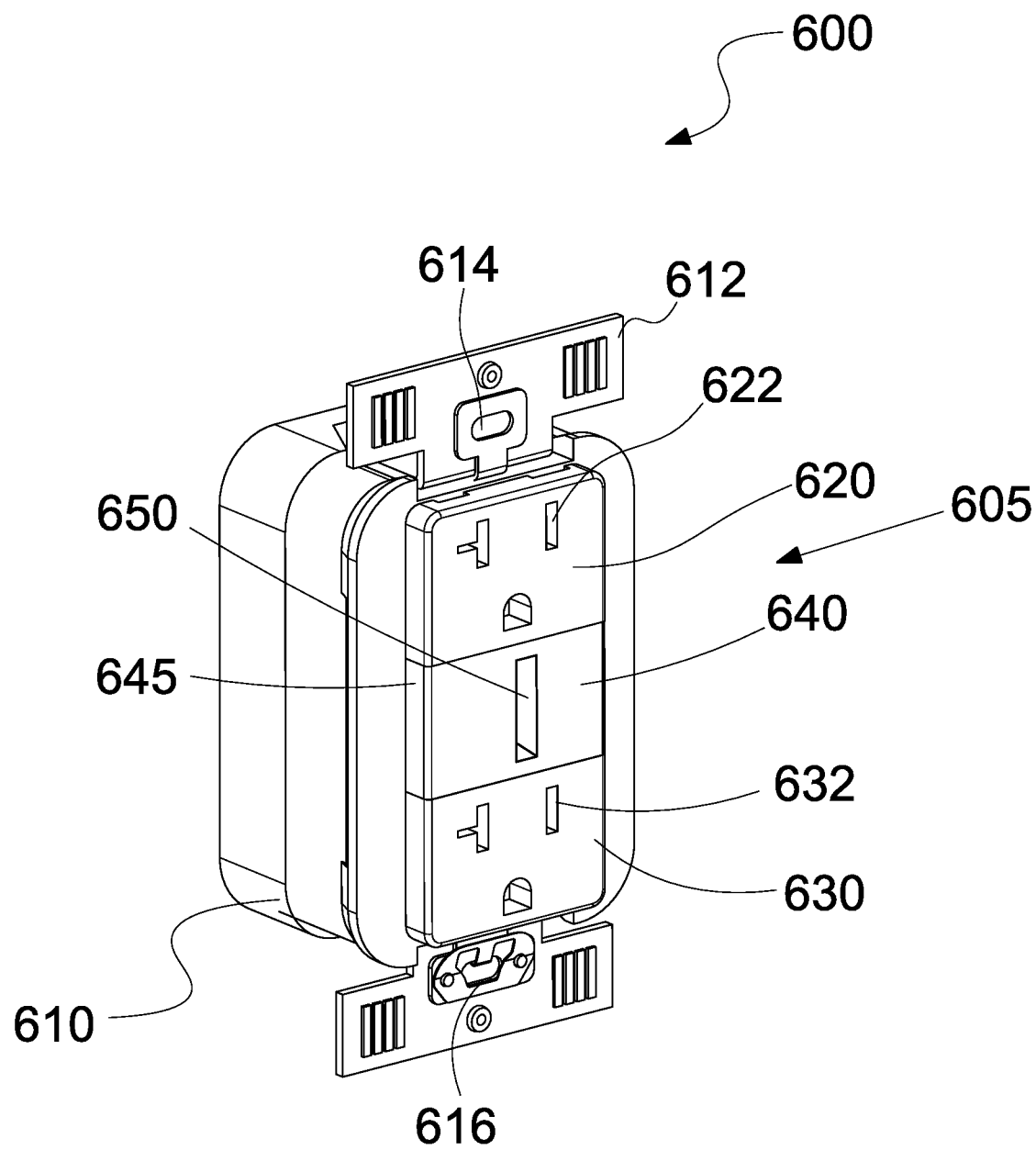
FIG. 6 is a perspective view of a second embodiment of a wiring device with a user-interchangeable module having a battery pack, the user-interchangeable module inserted into the housing of the wiring device, according to the disclosure.
Figure 7A:
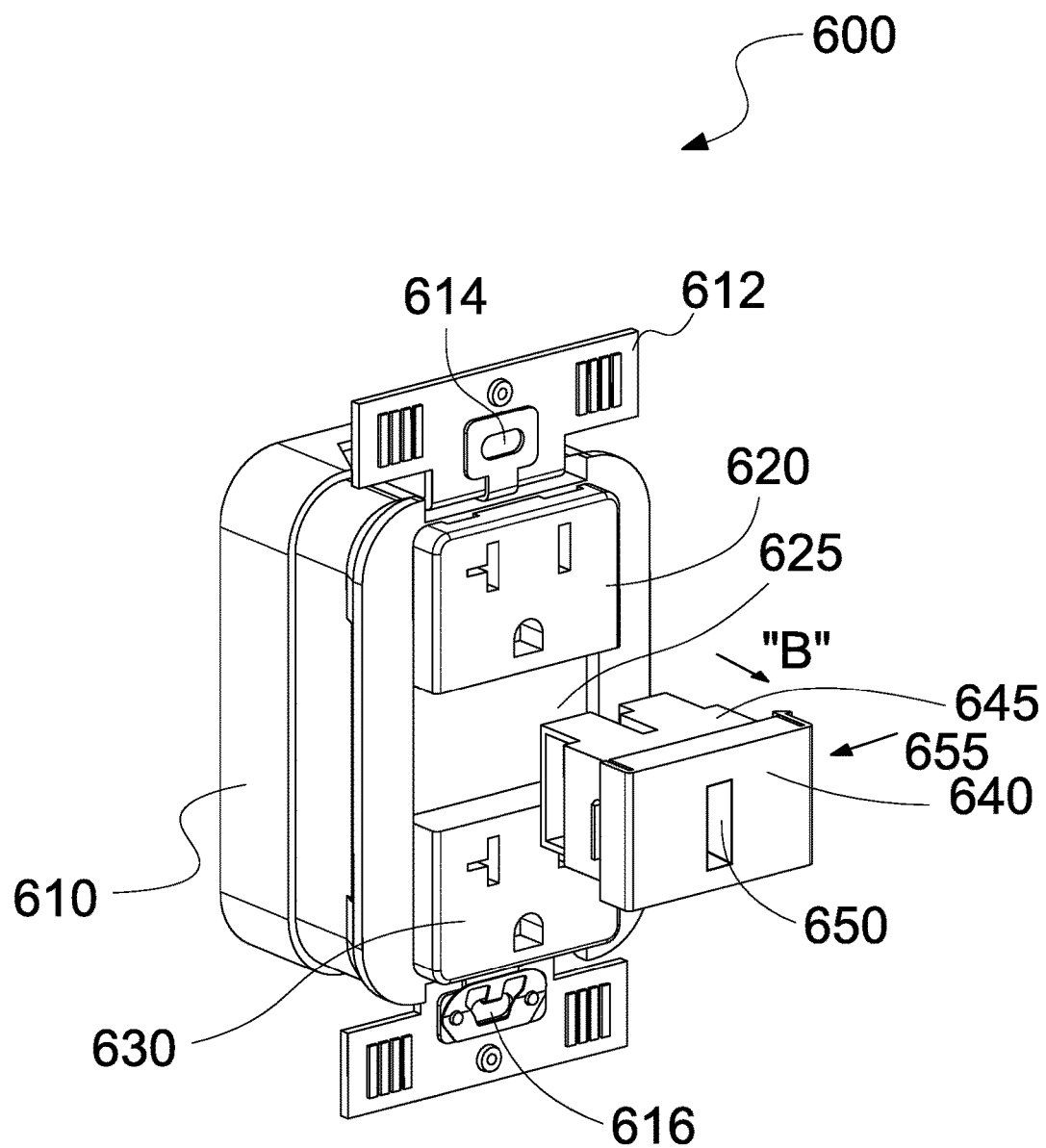
FIG. 7A is a perspective view of the wiring device of FIG. 6 with the user-interchangeable module having the battery pack removed from the housing of the wiring device, according to the disclosure.

FIG. 6 is a perspective view of a second embodiment of a wiring device 600 with an interchangeable module 655 having a battery pack 645 inserted into the housing 610 of the wiring device 600, according to the disclosure. FIG. 7A is a perspective view of the wiring device of FIG. 6 with the interchangeable module 655 having the battery pack 645 removed from the housing 610 of the wiring device 600, according to the disclosure, whereas FIG. 7B is a perspective view of the wiring device 600 of FIG. 6 with the battery pack 645 of the interchangeable module 655 including a built-in retractable cord 710, according to the disclosure.

The wiring device 100 (FIG. 1) is configured to charge the replaceable battery pack 645 and an external device, such as an electronic device, connected to the USB charging ports 142, 152 simultaneously. The battery pack 645 conducts an electronic handshake with the wiring device 100, as will be discussed in detail further below. Further, the battery pack 645 further comprises charging circuitry 800, 900 (FIGS. 8 and 9), the charging circuitry 800, 900 being configured to provide charging current to an external device, such as an electronic device, when the battery pack 645 is disconnected from the wiring device 100.

Figure 7B:
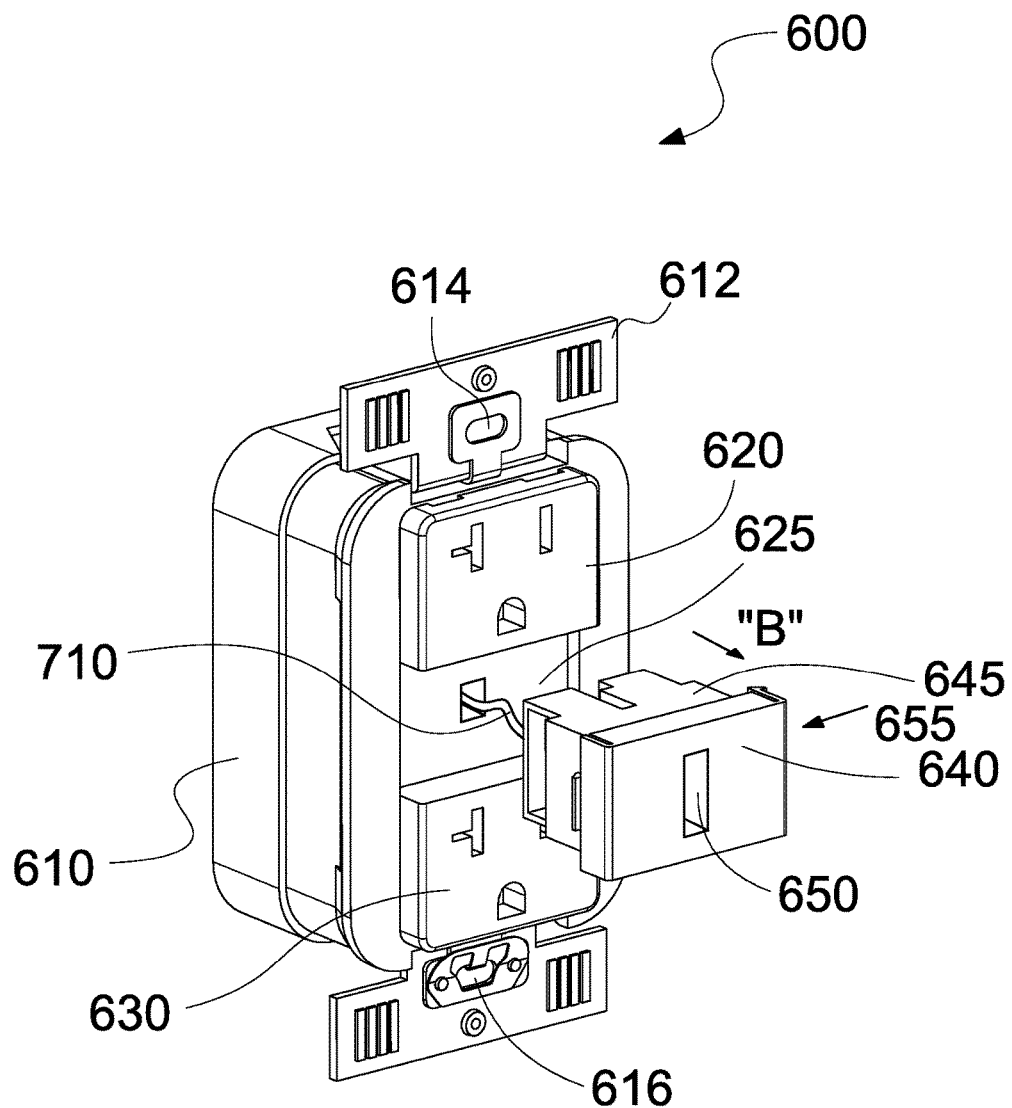
FIG. 7B is a perspective view of the wiring device of FIG. 6 with the battery pack of the user-interchangeable module including a built-in retractable cord, according to the disclosure.

FIGS. 6, 7A, and 7B show the second embodiment of wiring device 600 configured to be fastened to an electrical box (or a mud ring). Wiring device 600 includes a housing 610 and a user-accessible face 605 which is accessible after wiring device 600 is fastened to the electrical box. Face 605 includes a plurality of regions, that is, a top region 620, a bottom region 630, and a central region 640. The top and bottom regions 620, 630 each have a line voltage electrical outlet. The top region 620 includes outlet apertures 622 and the bottom region 630 includes outlet apertures 632. In this embodiment, face 605 is generally rectangular but can take any suitable shape. This rectangular shape is sometimes referred to as "decorator style" in the electrical industry.

The central region 640 receives an interchangeable module 655 having a replaceable battery pack 645, the interchangeable module 655 including a low voltage port 650. The interchangeable module 655 having the replaceable battery pack 645 is inserted into region 625 of housing 610 (see FIG. 7A). The low voltage port 650 is oriented in a vertical configuration. In the present embodiment, the low voltage port is in the form of a USB charging port that can be used to charge any suitable equipment, such as, but not limited to, cell phones, tablets, laptops, and the like. In an alternative embodiment, just one of the top or bottom regions 620, 630 may have a line voltage electrical outlet and the other may have an interchangeable module with a replaceable battery pack.

As illustrated in FIG. 7A, the interchangeable module 655 having the replaceable battery pack 645 may be moved in direction "B" to be removed from the housing 610. As noted above, the low voltage port 650 is a USB charging port.

The replaceable battery pack 645 can be charged at the same time (i.e., simultaneously) as the charging of an electronic device or external device connected to the low voltage port 650. Thus, the replaceable battery pack 645 is charged while it is connected to wiring device 600. When the replaceable battery pack 645 is removed from the wiring device 600, the replaceable battery pack 645 becomes a battery backup to charge the portable electronic device when no connection to AC power is present. Moreover, as illustrated in FIG. 7B, the replaceable battery pack 645 may also include a retractable cord 710. Thus, a user is able to charge both the battery pack 645, as well as an electronic device attached to the interchangeable module 655. As a result, if the battery of the electronic device runs out of power, a battery backup (i.e., the replaceable battery pack 645) may be used to charge the electronic device if the user cannot access a line voltage. Additionally, the user may select a full charge or a quick charge. Therefore, the replaceable battery pack 645 of the interchangeable module 655 may include a selection means for allowing the user to select how much power to provide to the electronic device.

Wiring device 600 also includes a strap 612 which is used to fasten the wiring device 600 to an electrical box. As will be understood by one of ordinary skill in the art, the strap 612 includes a first mounting aperture 614 and a second mounting aperture 616 which receive screws which fasten the wiring device 600 to the electrical box. Housing 610, in combination with the face 605, cooperate to enclose the internal components of wiring device 600. Alternatively, other suitable embodiments of wiring device 600 which do not contain line voltage may be fastened to a mud ring instead of an electrical box.

Figure 8:
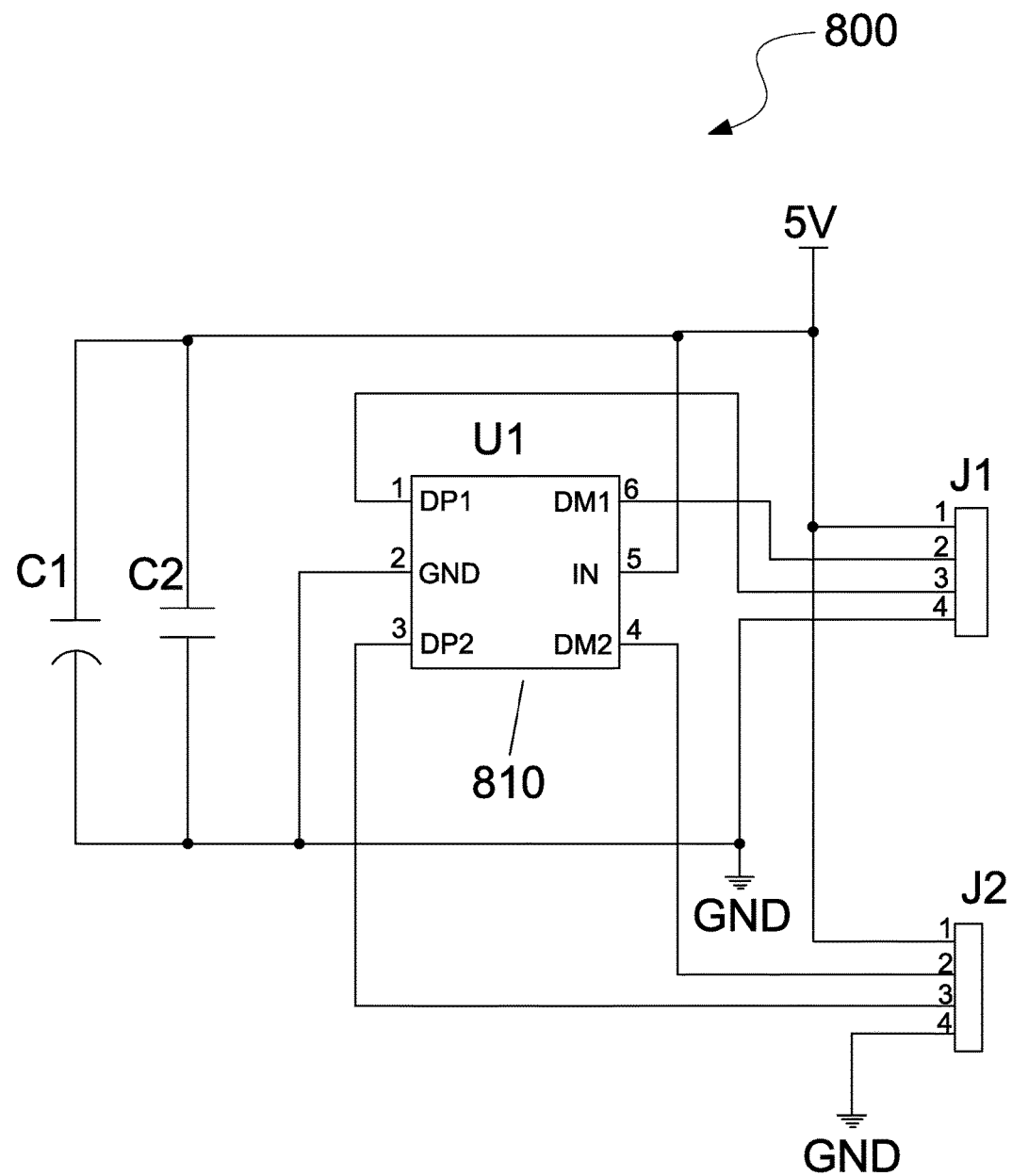
FIG. 8 illustrates circuitry of a logic printed circuit board (PCB), according to the disclosure.
Figure 9:
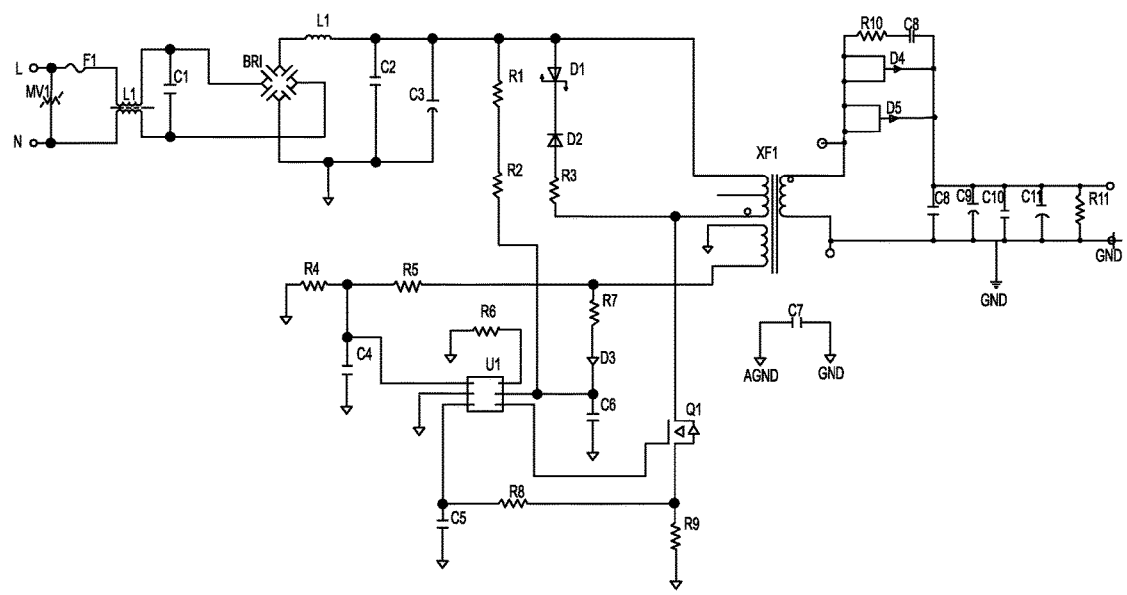
FIG. 9 illustrates circuitry of a power PCB, according to the disclosure.

FIG. 8 illustrates charging circuitry 800 of the logic printed circuit board (PCB), according to the disclosure, whereas FIG. 9 illustrates charging circuitry 900 of power PCB, according to the disclosure.

Each of the interchangeable modules 142, 152 of the present disclosure may include charging circuitry 800, 900. The charging circuitry 800, 900 may include an electrical operating parameter configurable automatically by a characteristic of the user interchangeable modules 142, 152 or to the external device that is communicated to the charging circuitry. The charging circuitry 800 may reside on a logic PCB (not shown), whereas the charging circuitry 900 may reside on a power PCB (not shown). The logic PCB may be joined to the power PCB by any suitable method, including, but not limited to, soldering, adhesive, etc. Alternatively, the logic PCB and the power PCB may be electrically connected together through any suitable medium, such as, but not limited to, PCB connector(s), wires, bus bars, or any combination thereof. The power PCB receives line voltage from conductors (e.g., phase and neutral; not shown). The conductors may be connected directly to a power line. Alternatively, the conductors may have a standard plug configuration for connection with a standard wall receptacle.

The circuitry 800, 900 is used to transform line voltage from an external source (e.g., an outlet; not shown) to low voltage. The circuitry 800, 900 receives power from the external source and distributes power to the components of the interchangeable module 142, 152. The circuitry 800, 900 is configured to charge various rechargeable consumer electronic devices, such as, portable devices (e.g., cell phones, laptops, tablets, personal digital assistants, etc.). The electronic devices may also be referred to as external devices.

More information regarding circuitry 800, 900 may be found in U.S. Application No. 2015/0035476 commonly owned by the present Applicant, and incorporated by reference in its entirety herein.

In operation, when an electronic device (not shown) is connected to one of the interchangeable modules 142, 152, voltage measurements are taken by one or more resistors of circuitry 900 of FIG. 9. Signals are communicated to one or more pins of the microprocessor 810 of circuitry 800 of FIG. 8. The signals are kept in a high impedance state. A status signal is communicated to the microprocessor 810 when an electronic device is initially attached to one of the interchangeable modules 142, 152 and requests charging. Data pins DP1 and DP2, shown in FIG. 8, are then used to transfer data between the attached electronic device and interchangeable module 142, 152 to electronic device is attached to. The data pins DP1 and DP2 allow for an electronic handshake. The characteristic of the user-interchangeable modules 142, 152 further includes the electronic handshake with the circuitry 800, 900 of the wiring device 100. The electronic handshake allows the microprocessor 810 to communicate with the attached electronic device. The electronic device may determine how much current to draw. Alternatively, the interchangeable module may determine how much current to provide to the electronic device. The microprocessor 810 then regulates/controls flow of current to the electronic device connected to one of the interchangeable modules 142, 152. Additionally, the characteristic of the user-interchangeable modules 142, 152 configures the wiring device 100 based on the type of port included on the user-interchangeable modules 142, 152.

More information regarding detailed communication between the electronic device and one or more low voltage ports may be found in U.S. Application No. 2015/0035476 and U.S. Application No. 2015/0038006, both commonly owned by the present Applicant, and both incorporated by reference in their entirety herein.

Moreover, the replaceable battery pack 645 of the interchangeable module 655 may be powered in a similar manner as described above with reference to the interchangeable modules 142, 152 of FIGS. 1-4. For example, the circuitry 800, 900 may be used to transform line voltage to low voltage. The circuitry 800, 900 receives power from an external source and distributes the power to the interchangeable module 655 having the battery pack 645. The replaceable battery pack 645 may be charged either directly from the circuitry 800, 900 or indirectly from the interchangeable module 655.

Figure 10:
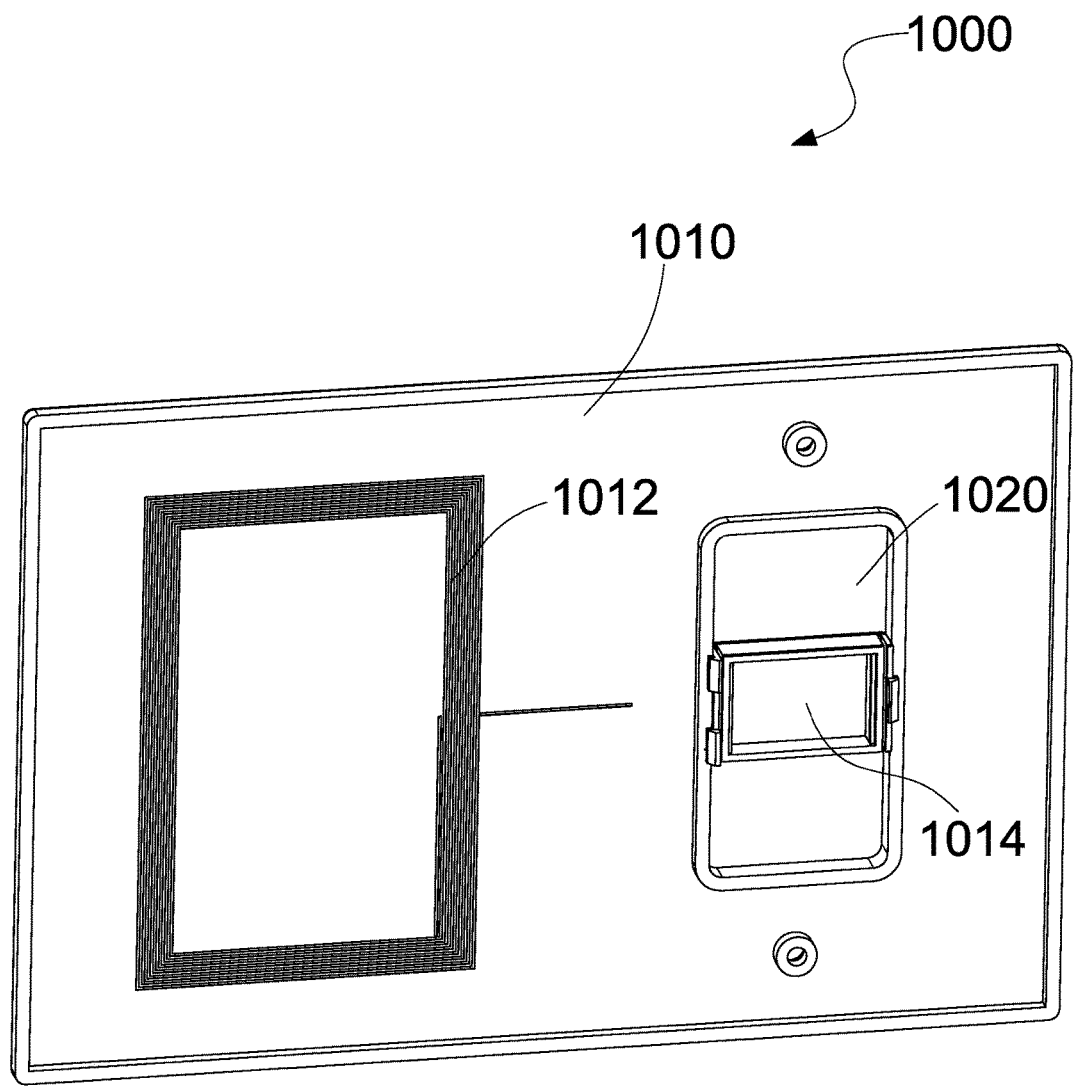
FIG. 10 is a rear perspective view of a wall plate with coil, according to the disclosure.
Figure 11:
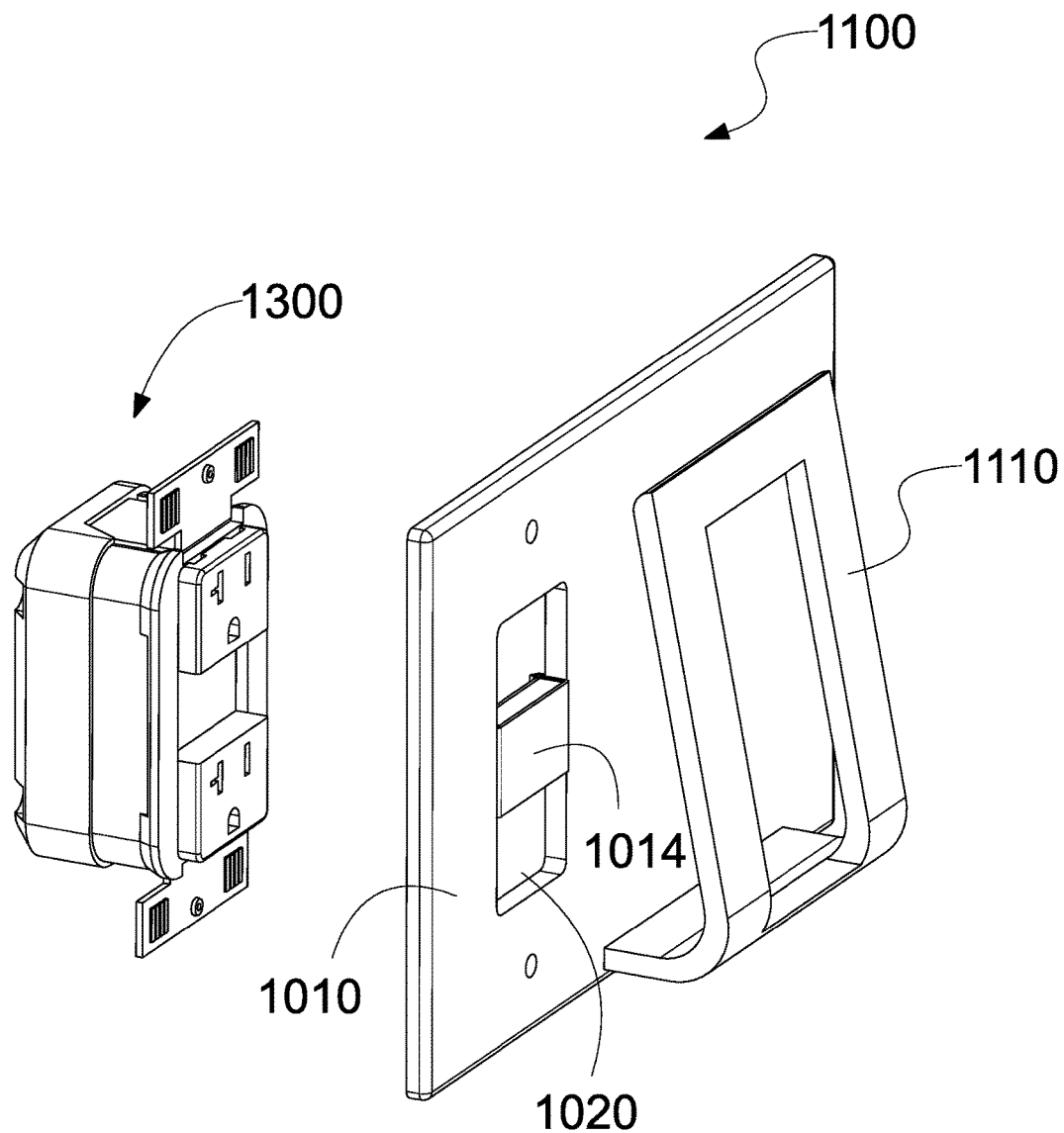
FIG. 11 is a front perspective view of the wall plate attached to the wiring device, the wall plate including a retaining member, according to the disclosure.

FIG. 10 is a rear perspective view 1000 of a wall plate 1010 with coil 1012, according to the disclosure, whereas FIG. 11 is an exploded front perspective view 1100 of the wall plate 1010 and wiring device 1300, the wall plate including a retaining member 1110, according to the disclosure. The coil 1012 of FIG. 10 may be made out of a flat wire, may be attached to a ferromagnetic plate for increased efficiency, may have a different number of turns depending on the application, and may have multiple smaller coils used to provide for increased field coverage. The coil 1012 provides a wireless design option for mobile devices that have this feature built-in. Thus, the wireless coil 1012 can be used for contactless charging.

The wall plate 1010 includes an opening 1020 for receiving the wiring device 1300 (see FIG. 11). The opening 1020 also includes a blank cover 1014 for receiving an interchangeable module therein. The wall plate 1010 further includes a retaining member 1110 for retaining an electronic device, as the electronic device is being charged by the interchangeable module having a low voltage port. Thus, a user may securely position an electronic device being charged by interchangeable modules adjacent to the wall plate 1010.

Figure 12:
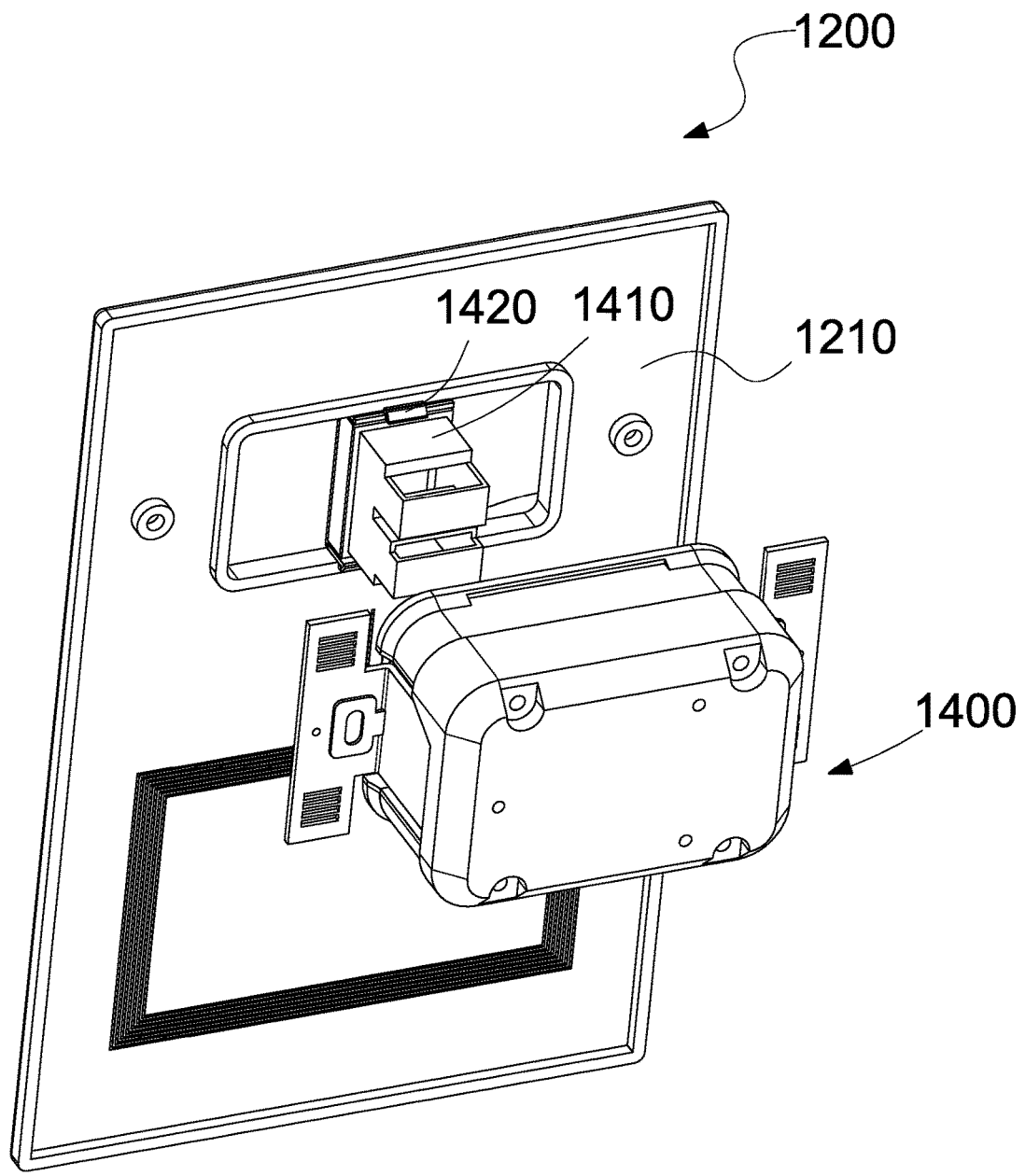
FIG. 12 is a perspective view of the wall plate being attached to the wiring device, the all plate configured to interface with a replaceable battery pack, according to the disclosure.

FIG. 12 is a perspective view 1200 of a wall plate 1210 being attached to the wiring device 1400, according to the disclosure.

The wiring device 1400 includes an interchangeable module having a replaceable battery pack 1410 that is connected to the wall plate 1210 via the battery pack retainer component 1420. Thus, the wall plate 1210 is compatible with wiring devices 1400 that include replaceable battery pack 1410.

Additionally, regarding the exemplary embodiments of the present disclosure, the interchangeable modules and/or wiring devices may include digital rights management (DRM) code. The DRM code may be computer software or relate to encryption or watermarking techniques. The DRM code relates to access control technologies that limit the usage of interchangeable modules with certain wiring devices. The DRM code ensures that only appropriate interchangeable modules have the capability to interact with the wiring devices described herein. In other words, the DRM code would lock out interchangeable modules not designed to work with or be compatible with the wiring devices described herein.

Of course, electrical, mechanical, electromechanical, and/or electronic access control techniques or mechanisms may be employed to deter non-compatible user-interchangeable modules from interacting with the wiring devices disclosed herein. Thus, the user-interchangeable modules may be authenticated as authorized user-interchangeable modules. One skilled in the art may contemplate a plurality of different electrical, mechanical, and/or electromechanical techniques to limit the usage of user-interchangeable modules with certain wiring devices. For example, an electrical/electronic interface may be made between a user-interchangeable module and the wiring device such that the user-interchangeable module is identified and/or authorized through the interface. For example, an element of known resistance or impedance may be included in the user-interchangeable module which is measured by the wiring device. Alternatively, a specific current or voltage signal may be generated by the user-interchangeable module and interfaced with the wiring device. The interface between the user-interchangeable module and the wiring device may be of any suitable type such as a serial or parallel interface.

In some embodiments, once authenticated, the wiring device can be configured to provide the required charging level/current (alternatively, the configuration may occur without authentication). The configuration of the wiring device may be achieved by a plurality of different electrical, mechanical, and/or electromechanical techniques. For example, an element of known resistance or impedance may be included in the user-interchangeable module which is measured by the wiring device. Alternatively, a specific current or voltage signal may be generated by the user-interchangeable module and interfaced with the wiring device. The interface between the user-interchangeable module and the wiring device may be of any suitable type such as a serial (including USB) or parallel interface. Alternatively, or in addition, the interface between the user-interchangeable module and the wiring device may be made wirelessly by any suitable means such as via a personal area network (PAN). Examples of PAN's are Bluetooth and Bluetooth Low Energy. Alternatively, or additionally, a physical key may be located on the user-interchangeable module and the wiring device includes a switch which is actuated when user-interchangeable module is located in the housing of the wiring device.

In another embodiment, the wiring device is configured by the electronic device connected to the interchangeable module. In a further embodiment, the wiring device is configured by both the user-interchangeable module and the electronic device connected to the interchangeable module.

Such configuration of the wiring device may occur for embodiments where user-interchangeable modules having low voltage ports and/or for embodiments with user-interchangeable modules having a battery pack.

Furthermore, such configuration of the wiring device may include selecting one or more USB power delivery profiles. For example, USB Profile 1 provides 2 amps at 5 Volts (10 Watts). USB Profile 2 provides 1.5 amps at 12 Volts (18W). USB Profile 3 provides 3 amps at 12 Volts (36W). USB Profile 4 provides 3 amps at 20 Volts (60W). USB Profile 5 provides either 5 amps at 12 Volts (60W) or 5 amps at 20 Volts (100W).

While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision additional modifications, features, and advantages within the scope and spirit of the claims appended hereto.

The invention claimed is:

1. A wiring device, comprising:
   a strap having mounting holes to facilitate fastening of the wiring device to an electrical box;
   a housing having a face accessible when the wiring device is fastened to the electrical box, the face having an area divided into a first region and a second region, the second region of the face being configured to removably receive either one of a plurality of user-interchangeable modules selected from the group consisting of a Type A Universal Serial Bus (USB) module and a Type C USB module, wherein the Type A USB module includes a Type A USB port and the Type C USB module includes a Type C USB port, the Type A USB port and Type C USB port each configured to receive a respective male charging connector in electrical communication with an external device;
   a first line voltage electrical outlet accessible through a first aperture on the first region of the face; and
   a charging circuit in electrical communication with the one of the plurality of user-interchangeable modules, the charging circuit configured to:
      receive characteristic information from the one of the plurality of user-interchangeable modules;
      select one or more USB power delivery profiles based on the characteristic information; and
      communicate the selected one or more USB power delivery profiles to the external device.

2. The wiring device according to claim 1, wherein the area of the face further comprises a third region, and the wiring device further comprises a second line voltage electrical outlet accessible through a second aperture on the third region of the face.

3. The wiring device according to claim 1, wherein the area of the face further comprises a third region, and the wiring device further comprises a second user-interchangeable module including a rechargeable battery pack, the second user-interchangeable module received within the third region.

4. The wiring device according to claim 3, wherein the charging circuit is configured to provide charging current to the external device and the rechargeable battery pack simultaneously.

5. The wiring device according to claim 1, wherein the characteristic information of the one of the plurality of user-interchangeable modules or the external device is an electrical signal.

6. The wiring device according to claim 1, wherein the characteristic information of the one of the plurality of user-interchangeable modules or the external device is a wireless signal.

7. The wiring device according to claim 1, wherein the characteristic information of the one of the plurality of user-interchangeable modules is communicated via an electronic handshake with the charging circuit of the wiring device.

8. The wiring device according to claim 1, wherein each of the selected one or more USB power delivery profiles comprises a charging current and a charging voltage, the charging current and charging voltage being one selected from the group consisting of:
   2 Amps at 5 Volts;
   1.5 Amps at 12 Volts;
   3 Amps at 12 Volts;
   3 Amps at 20 Volts;
   5 Amps at 12 Volts; and
   5 Amps at 20 Volts.

9. The wiring device according to claim 1, wherein the one of the plurality of user-interchangeable modules includes an access control mechanism for authorizing the one of the plurality of user-interchangeable modules to communicate with the charging circuit of the wiring device.

10. The wiring device according to claim 1, wherein the one of the plurality of user-interchangeable modules is accessible on a first portion of the second region of the face,
   wherein the wiring device further comprises a second user-interchangeable module accessible on a second portion of the second region of the face, the second user-interchangeable module including a low voltage port configured to receive the male charging connector of a charging cable connected to the external device, the second user-interchangeable module being removable from the housing of the wiring device, and
   wherein the charging circuit is in electrical communication with the second user-interchangeable module and is configured to receive second characteristic information from the second user-interchangeable module.

11. The wiring device according to claim 10, wherein the area of the face further comprises a third region, and
   wherein the wiring device further comprises a second line voltage electrical outlet accessible through a second set of apertures on the third region of the face.

12. The wiring device according to claim 1, further comprising a printed circuit board (PCB), the PCB comprising a plurality of prongs extending out therefrom, wherein the one of the plurality of user-interchangeable modules further comprises a rear end, the rear end comprising a plurality of terminals, wherein the plurality of terminals are adapted and dimensioned to engage the prongs of the PCB.

13. The wiring device according to claim 1, wherein the one of the plurality of user-interchangeable modules includes a rechargeable battery pack.

14. The wiring device according to claim 13, wherein the charging circuit is configured to provide charging current to the external device and the rechargeable battery pack simultaneously.

15. The wiring device according to claim 1, wherein the one of the plurality of user-interchangeable modules includes a physical key located on the one of the plurality of user-interchangeable modules,
wherein the wiring device includes a switch arranged and configured to be actuated by the physical key when the one of the plurality of user-interchangeable modules is received in the second region of the face, and
wherein the characteristic information of the one of the plurality of user-interchangeable modules is received via the physical key.

* * * * *